(12) United States Patent
He et al.

(10) Patent No.: US 8,551,626 B2
(45) Date of Patent: Oct. 8, 2013

(54) CCP-CPP MAGNETORESISTIVE READER WITH HIGH GMR VALUE

(75) Inventors: Qing He, Plymouth, MN (US); Yonghua Chen, Edina, MN (US); Juren Ding, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 435 days.

(21) Appl. No.: 12/491,936

(22) Filed: Jun. 25, 2009

(65) Prior Publication Data

US 2010/0330394 A1    Dec. 30, 2010

(51) Int. Cl.
G11B 5/39    (2006.01)

(52) U.S. Cl.
USPC ............... 428/811.1; 428/811.5; 360/324.2; 365/158; 365/171; 365/172; 365/173; 257/421; 324/207.21

(58) Field of Classification Search
None
See application file for complete search history.

(56) References Cited

U.S. PATENT DOCUMENTS

| | | | |
|---|---|---|---|
| 5,715,121 A | 2/1998 | Sakakima et al. | |
| 6,560,077 B2 * | 5/2003 | Fujiwara et al. | 360/324.1 |
| 6,566,872 B1 * | 5/2003 | Sugitani | 324/249 |
| 6,621,667 B1 * | 9/2003 | He et al. | 360/324.12 |
| 6,876,523 B2 | 4/2005 | Takahashi et al. | |
| 6,917,088 B2 | 7/2005 | Takahashi et al. | |
| 7,093,347 B2 | 8/2006 | Nowak et al. | |
| 7,116,529 B2 | 10/2006 | Yoshikawa et al. | |
| 7,525,776 B2 * | 4/2009 | Fukuzawa et al. | 360/324.12 |
| 7,598,555 B1 * | 10/2009 | Papworth Parkin | 257/295 |
| 7,610,674 B2 * | 11/2009 | Zhang et al. | 29/603.14 |
| 2005/0002126 A1 * | 1/2005 | Fujiwara et al. | 360/324.1 |
| 2005/0063100 A1 | 3/2005 | Kautzky et al. | |
| 2005/0099739 A1 | 5/2005 | Chang et al. | |
| 2005/0102820 A1 | 5/2005 | Chang et al. | |
| 2005/0168317 A1 | 8/2005 | Clifton et al. | |
| 2006/0050444 A1 | 3/2006 | Fukuzawa et al. | |
| 2006/0060901 A1 | 3/2006 | Nakamura et al. | |
| 2006/0098353 A1 | 5/2006 | Fukuzawa et al. | |
| 2006/0209472 A1 | 9/2006 | Koui et al. | |
| 2007/0039166 A1 | 2/2007 | Chang et al. | |
| 2007/0041124 A1 | 2/2007 | Chang et al. | |
| 2007/0047154 A1 | 3/2007 | Childress et al. | |
| 2007/0081276 A1 | 4/2007 | Fukuzawa et al. | |
| 2007/0097558 A1 | 5/2007 | Carey et al. | |
| 2007/0111332 A1 | 5/2007 | Zhao et al. | |
| 2007/0188936 A1 * | 8/2007 | Zhang et al. | 360/324.1 |
| 2007/0188945 A1 | 8/2007 | Fuji et al. | |
| 2008/0005891 A1 | 1/2008 | Yuasa et al. | |
| 2008/0008909 A1 | 1/2008 | Fuji et al. | |
| 2008/0026253 A1 * | 1/2008 | Yuasa et al. | 428/811 |
| 2008/0062577 A1 | 3/2008 | Fukuzawa et al. | |
| 2008/0068764 A1 | 3/2008 | Fukuzawa et al. | |
| 2008/0102315 A1 | 5/2008 | Fukuzawa et al. | |
| 2008/0150640 A1 | 6/2008 | Dimitrov et al. | |

(Continued)

Primary Examiner — Kevin Bernatz
(74) Attorney, Agent, or Firm — Hall Estill Attorneys at Law (57) ABSTRACT

A magnetoresistive device having a high giant magnetoresistance (GMR) value and a moderate low resistance area product (RA) includes a first magnetic layer, a second magnetic layer, and a current confined path (CCP) spacer layer positioned between the first magnetic layer and the second magnetic layer. The spacer layer includes copper current confined paths extending between the first magnetic layer and the second magnetic layer in a matrix of magnesium oxide. The spacer layer is formed by a mixture copper and magnesium oxide, which is heattreated to form the copper current confined paths within the magnesium oxide matrix.

20 Claims, 8 Drawing Sheets

(56) References Cited

U.S. PATENT DOCUMENTS

| | | |
|---|---|---|
| 2008/0151439 A1 | 6/2008 | Pinarbasi |
| 2008/0278864 A1* | 11/2008 | Zhang et al. ............. 360/324.12 |
| 2009/0251829 A1* | 10/2009 | Zhang et al. .................. 360/319 |
| 2011/0265325 A1* | 11/2011 | Zhang et al. .................... 29/887 |

* cited by examiner

CCP-CPP MAGNETORESISTIVE READER WITH HIGH GMR VALUE

BACKGROUND

Giant magnetoresistive (GMR) and tunneling magnetoresistive (TMR) devices have been developed for high density data storage applications. Both GMR and TMR devices feature a reader stack of multiple layers that include a nonmagnetic spacer layer between two ferromagnetic layers. Typically, one of the ferromagnetic layers acts as a reference or pinned layer having a fixed magnetization, while the other ferromagnetic layer referred to as a free layer has a magnetization that rotates in response to an external magnetic field. In a GMR device, the nonmagnetic spacer layer is electrically conductive. In a TMR device, the spacer layer is a very thin electrically insulating layer that forms a tunnel barrier between the free layer and the reference layer.

TMR reader stacks using magnesium oxide (MgO) have been used in the commercial hard drives with area density up to 500 Gb/in$^2$. As the area density further increases, the reader size (both reader width and reader stripe height) must decrease. This forces a reduction in the product of resistance and area (the RA product) for the MgO TMR stacks in order to maintain the same reader resistance. However, the reduction of RA for the MgO stack not only significantly decreases the TMR value, but also greatly increases the coupling field between the free layer and the reference layer in the TMR stack (the free layer H1 value). For example, the H1 value will go up to about 300 Oe when the RA is about 0.6 $\Omega\mu m^2$, and up to about 500 Oe when the RA is about 0.4 $\Omega\mu m^2$. Such a high free layer H1 value is not acceptable in a magnetic head application, because it may shift the asymmetry mean and/or require an extremely thick permanent magnet (PM) in order to align the free layer parallel to the air bearing surface (ABS). A much thicker PM sacrifices the shield-to-shield spacing and reduces the area density.

To achieve high GMR reader stacks with moderate low RA (0.1~0.4 $\Omega\mu m^2$), in past several years, research efforts have been directed to current-confined-path (CCP) current-perpendicular-to-plane (CPP) GMR readers for use in the hard drive industry. Examples of CCP-CPP GMR devices are described in Fukuzawa et al., US 2006/0050444; Fukuzawa et al., US 2006/0098353; Childress et al., US 2007/0047154; Carey et al., US 2007/0097558; Zhang et al., US 2007/0188936; Fuji et al., US 2008/0008909; Yuasa et al., US 2008/0026253; and Nowak et al. U.S. Pat. No. 7,093,347.

CCP-CPP readers may be made by doping some oxide particles into the spacer (like Cu) of the pure CPP stacks to increase the RA to moderate low RA (0.1~0.4 $\Omega\mu m^2$) from very low RA (less than 0.1 $\Omega\mu m^2$) in the pure CPP stacks. The function of the doped oxide section is only to confine the current path to increase the RA. It has little contribution to increase the GMR or even deteriorate the GMR value. Furthermore, in the traditional CCP reader designs, it is very difficult to control the size of the conductive channels or oxide particles within the nanometer range, as well as to control the size variation. This problem may lead to very large sensor-to-sensor RA and GMR variation within a wafer and may result in significant yield reduction in the mass production of magnetic read/write heads. Making very small (in nanometer or even angstrom range) and uniform conductive channels or oxide particles inside of the spacer layer is a very difficult technical challenge.

SUMMARY

A magnetoresistive device having a high giant magnetoresistance (GMR) value and a moderate low resistance area product (RA) includes a first magnetic layer, a second magnetic layer, and a current-confined-path (CCP) spacer layer positioned between the first magnetic layer and the second magnetic layer. The spacer layer includes copper current-confined-paths extending between the first magnetic layer and the second magnetic layer in a matrix of magnesium oxide.

The spacer layer may be formed as a mixed layer copper and magnesium oxide. The mixed layer is heattreated to form the copper current-confined-paths within the magnesium oxide matrix.

DETAILED DESCRIPTION

Figure 1:
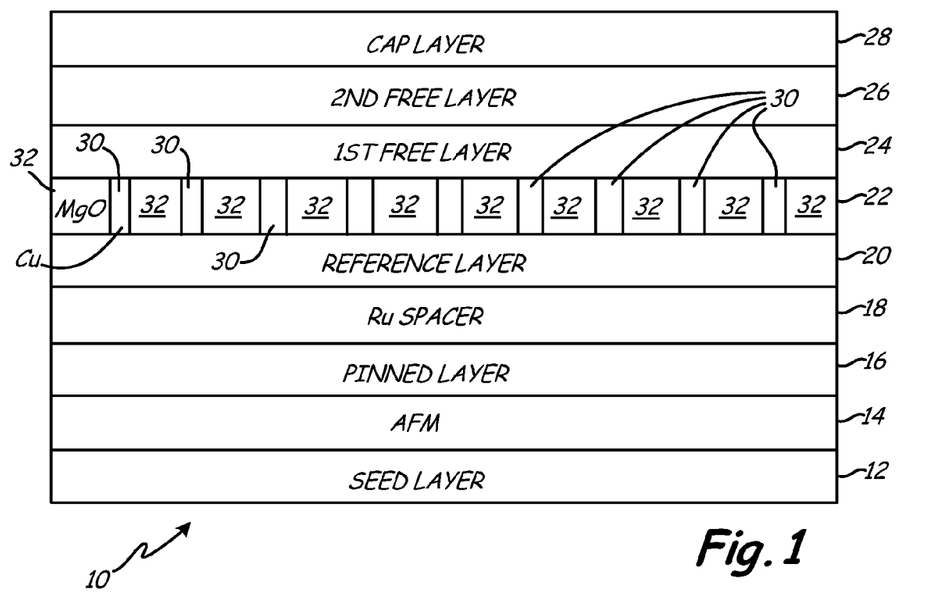
FIG. 1 shows a magnetoresistive CCP-CPP stack having a spacer layer with copper conductive channels in a magnesium oxide matrix.

FIG. 1 is a layer diagram of magnetoresistive stack 10, which is a current-perpendicular-to-plane (CPP), current-constrained-path (CCP), giant magnetoresistive (GMR) device. Magnetoresistive stack 10 includes seedlayer 12, antiferromagnetic (AFM) pinning layer 14, ferromagnetic pinned layer 16, coupling layer 18, reference layer 20, current-constrained-path (CCP) spacer layer 22, first ferromagnetic free layer 24, second ferromagnetic free layer 26, and cap layer 28.

Seedlayer 12 may be a single layer, or may be multiple layers. For example, seedlayer 12 may include a first layer of NiFeCr and a second layer of NiFe.

Pinning layer 14, which overlies seedlayer 12, is an antiferromagnetic material. Examples of antiferromagnetic materials that may form pinning layer 14 include CrMnCu, CrMnPd, CrMnPt, IrMn, NiMn, NiMnCr, PdMn, PdPtMn, PtMn, and PtRuMn.

Pinned layer 16, coupling layer 18, and reference layer 20 form a synthetic antiferromagnet. Pinned layer 16 and reference layer 20 are ferromagnetic materials, such as CoFe, CoFeB, and Heusler alloys such as $Co_2MnX$ where X is from the group consisting of Ge, Si, Al, Ga, and Sn. Coupling layer 18 is, for example, a ruthenium layer having a thickness that results in antiferromagnetic coupling between pinned layer 16 and reference layer 20. As a result, the magnetization direction of reference layer 20 is fixed, and provides a reference with respect to the magnetization direction of free layers 24 and 26.

Spacer layer 22 is composed of both copper and magnesium oxide. Copper conductive channels 30 are distributed throughout MgO matrix 32.

MgO matrix 32 is used to confine the current paths through spacer layer 22 between free layer 24 and reference layer 20, which increases resistance and therefore increases the RA product. In addition, MgO matrix 32 acts as a TMR barrier, which makes a major contribution to the total GMR value of stack 10.

Copper regions 30 within spacer layer 22 are used not only as a spacer in stack 10 to ensure a CPP spin valve effect, but also act as conductive channels that help to reduce the RA value. Thus, CCP layer 22 provides a combination of both TMR and spin valve effects. The RA value can be controlled by adjusting the ratio of MgO and copper regions in spacer layer 22 and by adjusting thickness of spacer layer 22.

CCP spacer layer 22 may include between about 1% and about 60% copper. More preferably, the percentage of copper within spacer layer 22 is about 5% to about 30%. The thickness of spacer layer 22 ranges from about 0.5 Å to about 15 Å. Preferably, the thickness of spacer layer 22 is in a range of about 4 Å to about 8 Å.

First free layer 24 may be a ferromagnetic material, such as CoFe or CoFeB having positive magnetostriction. Second free layer 26 overlies first free layer 24, and may be made of a ferromagnetic material such as NiFe having negative magnetostriction, so that the composite free layer formed by layers 24 and 26 will produce a high GMR value with net negative magnetostriction. The magnetization directions of free layers 24 and 26 are coupled together, and are free to rotate relative to the magnetization direction of reference layer 20. In other embodiments, only a single free layer is used.

Cap layer 28 may be a single layer structure, or may include multiple layers. Cap layer 28 may typically include an oxide or a metal or metal alloy capable of oxidation during high temperature annealing.

Figure 2:
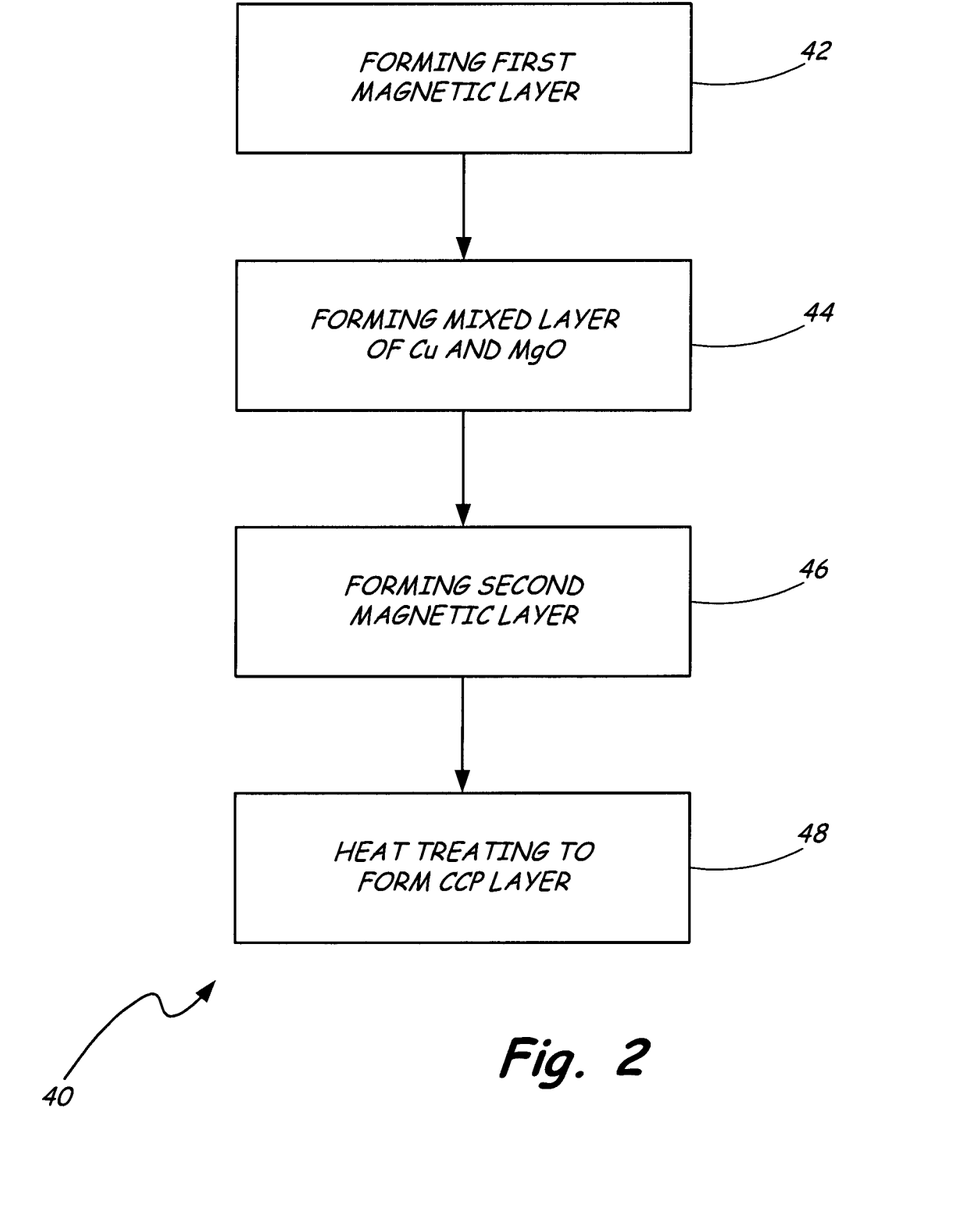
FIG. 2 is a flow chart illustrating a method of forming the CCP-CPP stack of FIG. 1.

FIG. 2 is a flow chart illustrating a method of forming a CCP-CPP device such as magnetoresistive stack 10 of FIG. 1. Method 40 includes forming a first magnetic layer (e.g. reference layer 20) (step 42); forming a mixed layer of copper and magnesium oxide over the first magnetic layer (step 44); depositing a second magnetic layer (e.g. free layer 24) mixed layer (step 46); and heat treating (or annealing) the mixed layer to form a CCP layer (e.g. CCP layer 22) containing Cu current confined regions (30) in a MgO matrix (32) (step 48).

Figure 3:
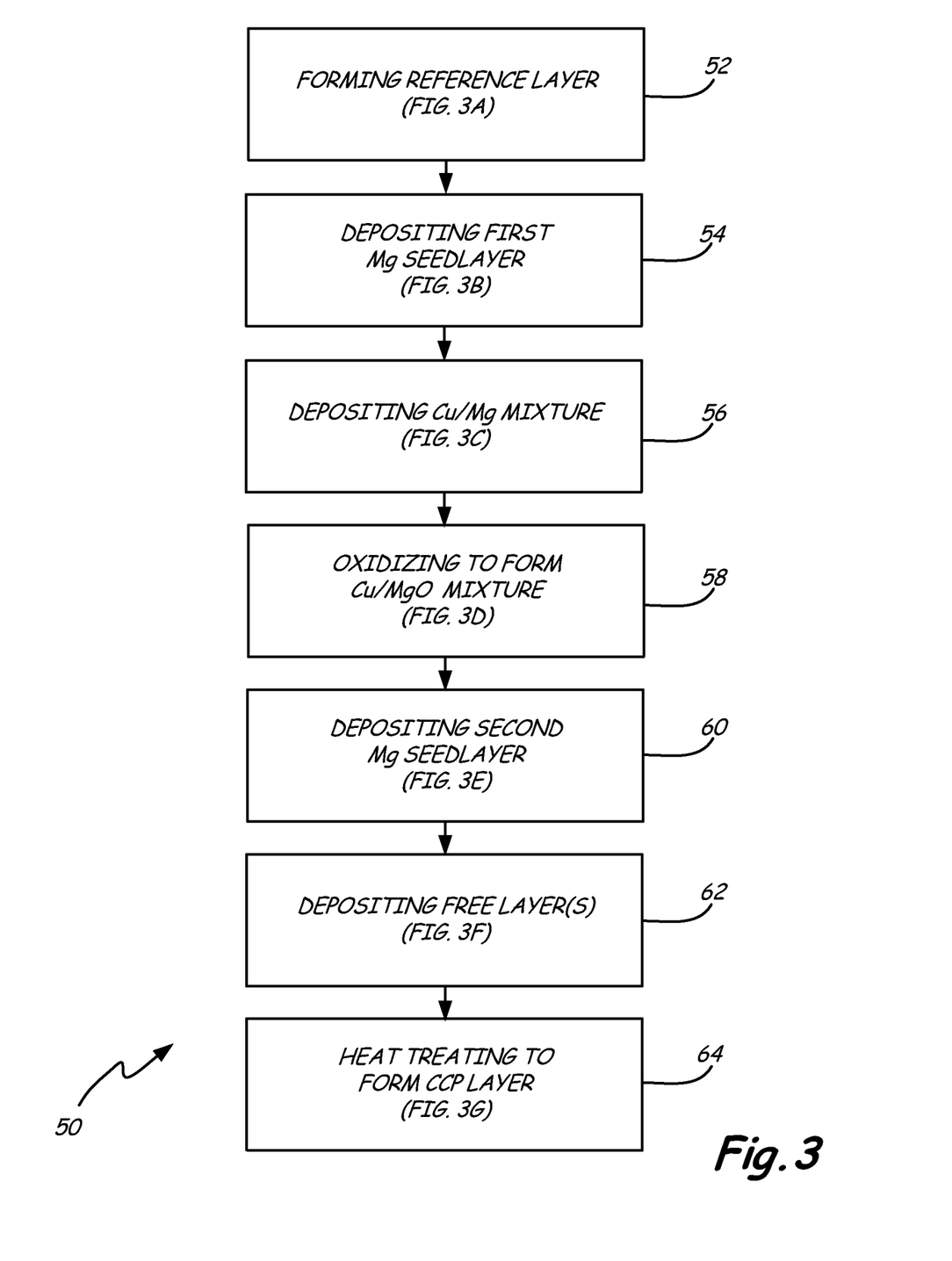
FIG. 3 is a flow chart illustrating a method of forming the CCP-CPP stack of FIG. 1 that includes deposition and partial oxidation of a Cu/Mg mixture layer.
Figure 3A:
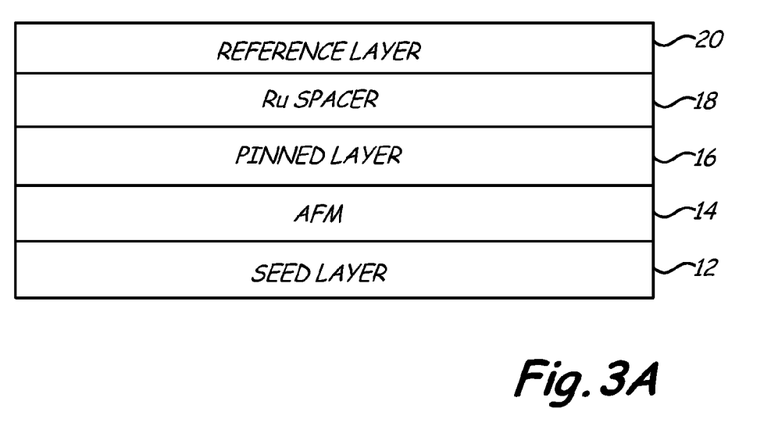
FIGS. 3A-3G illustrate steps of the method of FIG. 3.
Figure 3B:
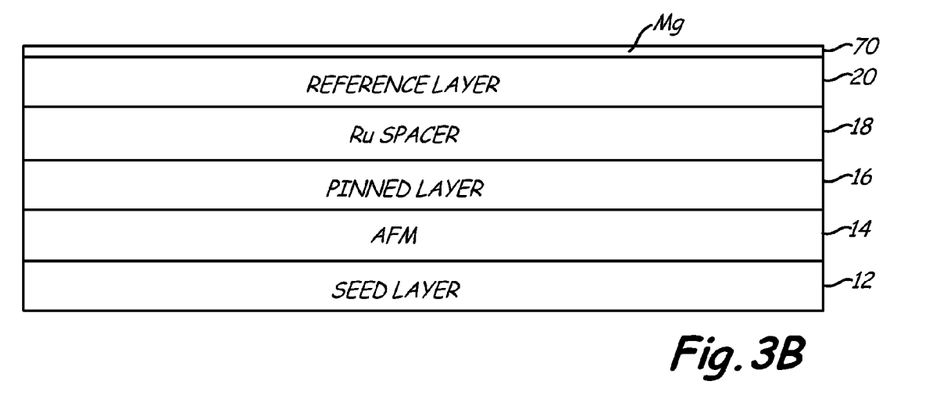
Figure 3C:
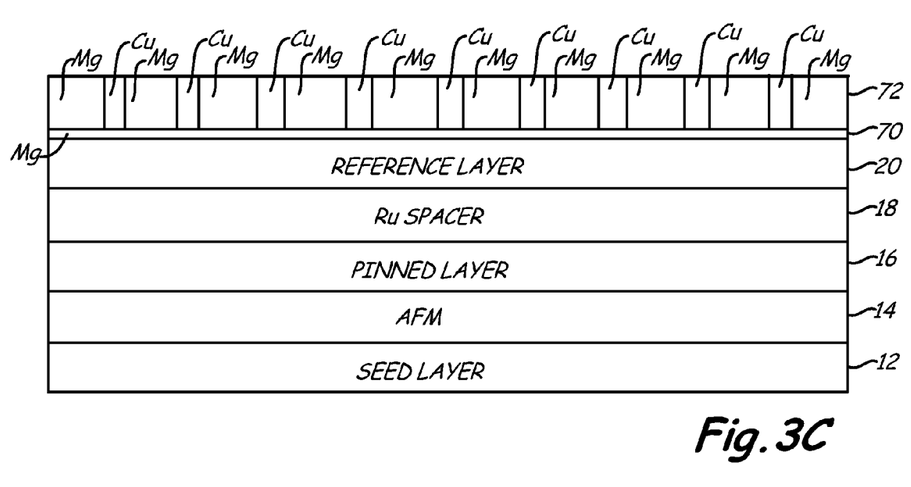

FIGS. 3 and 3A-3G illustrate a method of fabricating reader stack 10 that involves deposition of magnesium with copper (followed by a partial oxidation step) during the formation of CCP spacer layer 22. FIG. 3 is a flow chart illustrating method 50, which includes steps 52, 54, 56, 58, 60, 62, and 64. FIGS. 3A-3G illustrate steps 52-64, respectively. With this method, it is possible to achieve copper channels within a magnesium oxide matrix that are small and uniformly distributed. The result is high GMR, moderate low RA, a high Q value, (which is defined as the ratio of GMR over RA), and a low free layer coupling field H1.

In step 52 (FIG. 3A), seedlayer 12, pinning layer 14, pinned layer 16, coupling layer 18, and reference layer 20 have all been deposited. In step 54 (FIG. 3B), magnesium layer 70 is deposited on the top surface of reference layer 20. Magnesium layer 70 acts as a seedlayer for formation of magnesium oxide in spacer layer 22. The thickness of magnesium layer 70 is a range of about 0.5 Å to about 5 Å, and more preferably about 2.5 Å. At these thicknesses, magnesium layer 70 contains many pinholes.

In step 56 (FIG. 3C), mixed layer 72 of copper and magnesium has been formed. The mixed layer 72 may be formed using RF sputtering from separate magnesium and copper targets, or RF sputtering from a single copper-magnesium target.

Figure 3D:
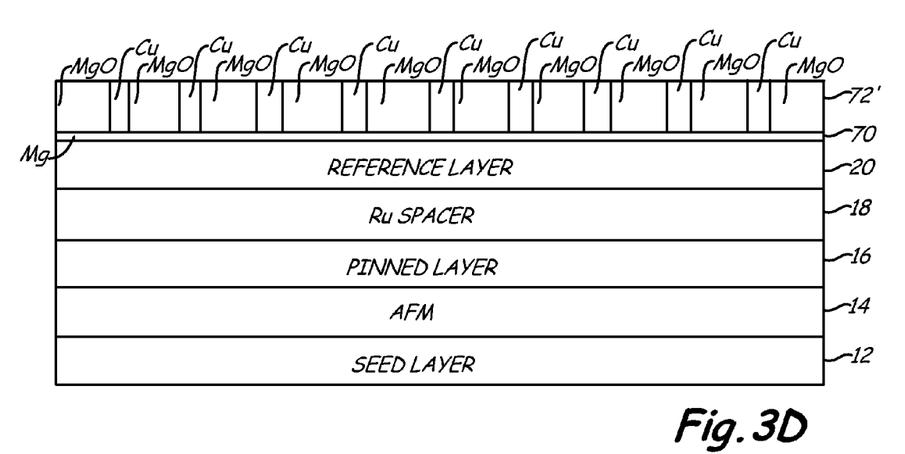
Figure 3E:
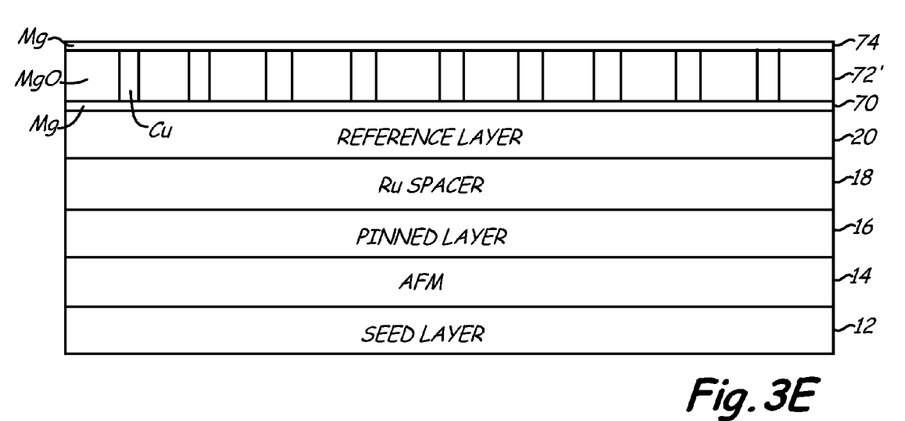

In step 58, a partial oxidation step is performed to convert mixed layer 72 of copper and magnesium to mixed layer 72' of copper and magnesium oxide. FIG. 3D shows mixed layer 72' after partial oxidation has taken place. The partial oxidation process can include plasma oxidation, radical shower oxidation, or natural oxidation. The oxidation is primarily of magnesium within layer 72'.

In step 60 (FIG. 3E), magnesium layer 74 has been deposited over mixed layer 72'. Magnesium layer 74 has a thickness in the range of about 0.5 Å to about 5 Å, and preferably is in the range of about 2.5 Å.

Figure 3F:
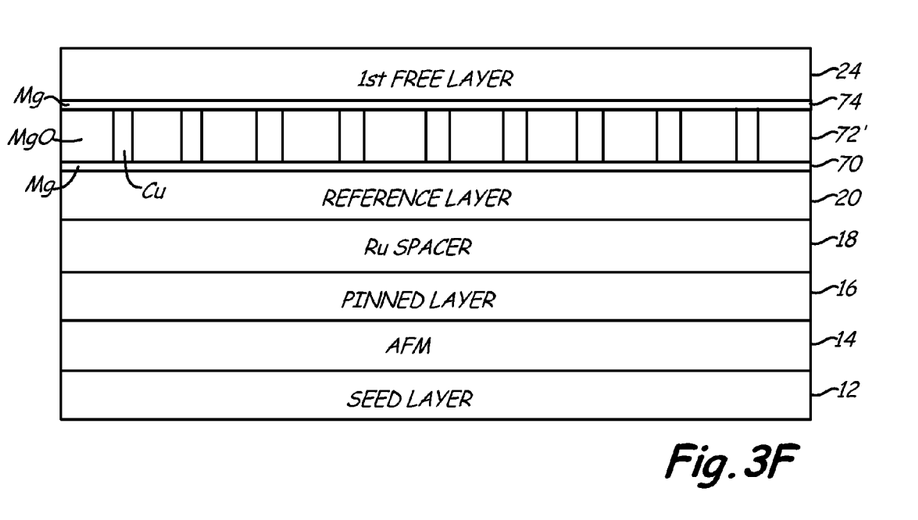
Figure 3G:
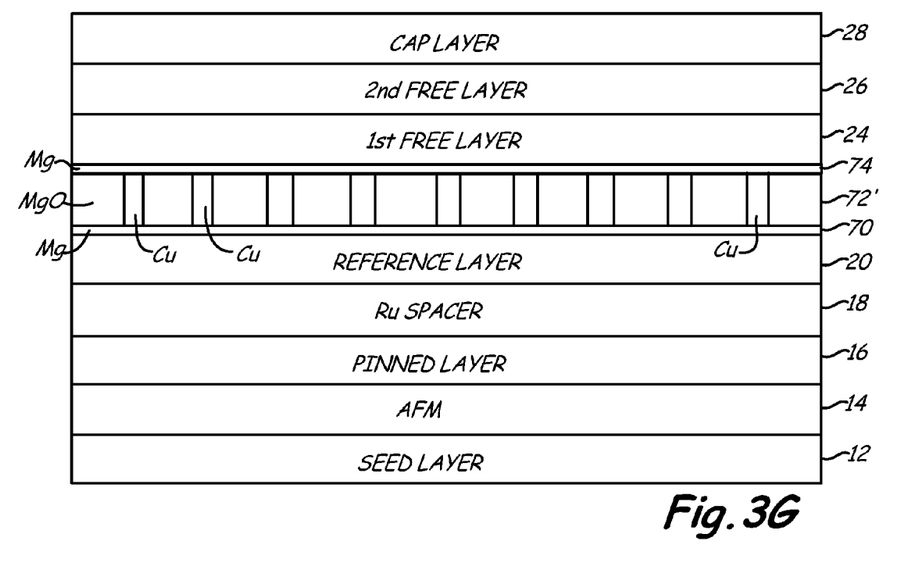

In step 62, first and second free layers 24 and 26 are deposited. FIG. 3F, shows stack 10 after first free layer 24 has been deposited. The process continues with deposition of second free layer 26 and cap layer 28 as shown in FIG. 3G.

In step 64, an anneal process (i.e. heat treating) is performed after deposition of full reader stack (including free and cap layers) to convert magnesium layers 70 and 74 and mixed layer 72' to spacer layer 22, in which copper conductive channels 30 are distributed throughout MgO matrix 32. FIG. 1 shows the structure of stack 10 after the anneal has been performed to complete formation of CCP spacer layer 22.

During anneal step 64, a transformation occurs within magnesium layers 70 and 74 and mixed layer 72'. Magnesium is very active, and easily oxidizes. The pin holes within magnesium layers 70 and 74 allow copper channels 30 to extend through and make contact with both reference layer 20 and first free layer 24. Copper channels 30 connecting reference layer 20 and first free layer 24 form the current-confined-paths through MgO matrix 32 of spacer layer 22.

The process described in FIGS. 3 and 3A-3G has a further benefit when reference layer 20 and free layer 24 are formed of CoFeB. The structure of CoFeB as deposited will typically be amorphous. The annealing process, in which magnesium oxide matrix 32 is formed within spacer layer 22 also has the effect of changing crystal structure at the interfaces with CoFeB reference layer 20 and first free layer 24. Magnesium oxide crystallizes first, while the CoFeB layers are still amorphous. The crystal structure of the magnesium oxide then grows into the adjacent layers during the anneal process so that a good lattice match is achieved. As a result, reference layer 20, magnesium oxide matrix 32, and free layer 24 all have the same crystal structure (body centered cubic or BCC). Copper, on the other hand, has a faced centered cubic (FCC) structure.

In other embodiments, the magnesium layers 70 and 74 may not be used, or only one of the two may be used. It has been found, however, that the addition of thin magnesium layers 70 and 74 in the process tends to enhance the overall GMR effect.

Figure 4:
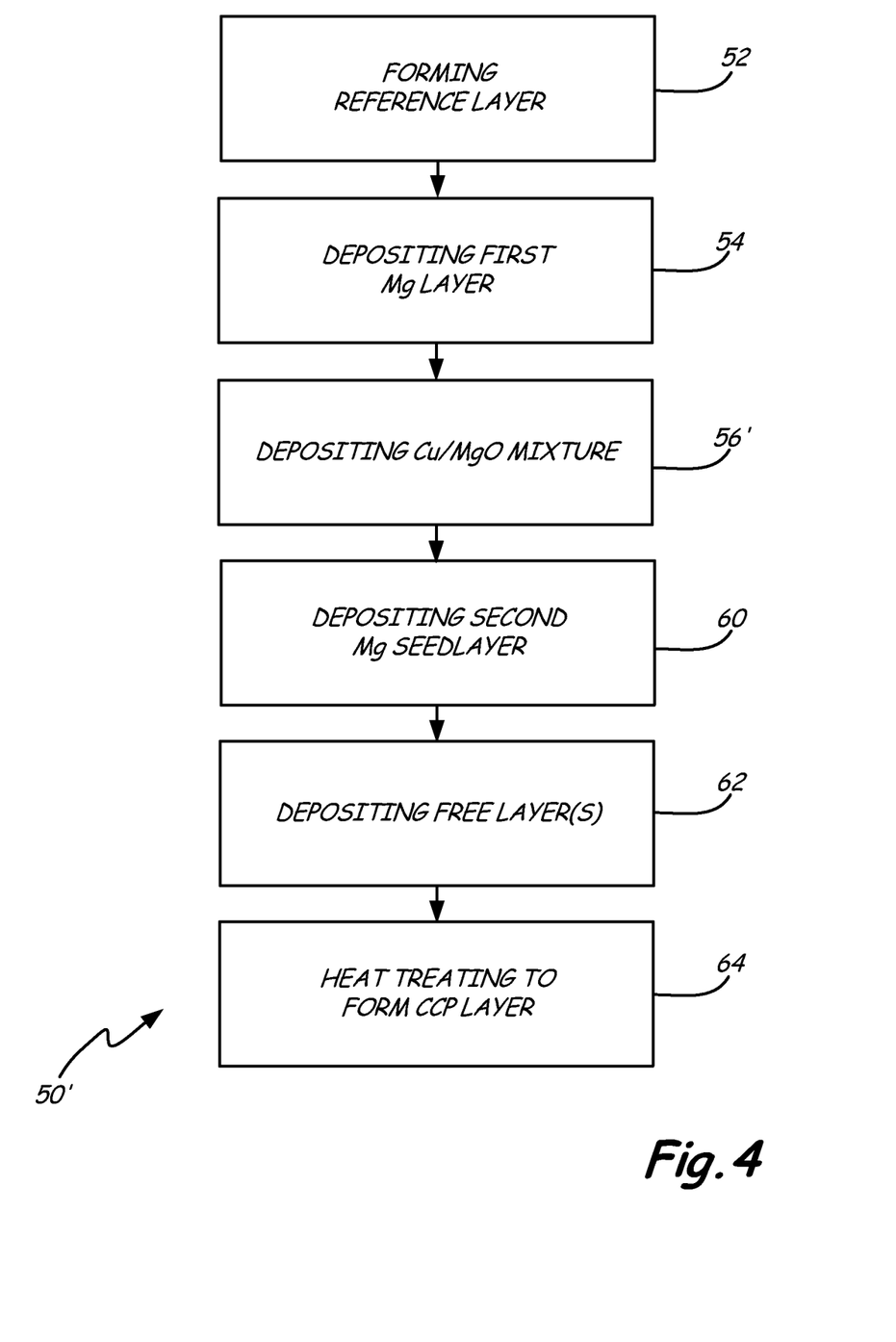
FIG. 4 is a flow chart illustrating a method of forming the CCP-CPP stack of FIG. 1 that includes deposition of a Cu/MgO mixture layer.

FIG. 4 illustrates alternative method 50', which is generally similar to method 50 of FIG. 3, except that the mixed layer is formed by depositing copper and magnesium oxide (step 56') rather than depositing copper and magnesium (step 56) and then partially oxidizing (step 58) to form the copper/magnesium oxide mixed layer. In method 50' (FIG. 4), the mixed layer may be formed, for example, by RF sputtering from separate magnesium oxide and copper targets, or RF sputtering from a single copper-magnesium oxide target.

Figure 5:
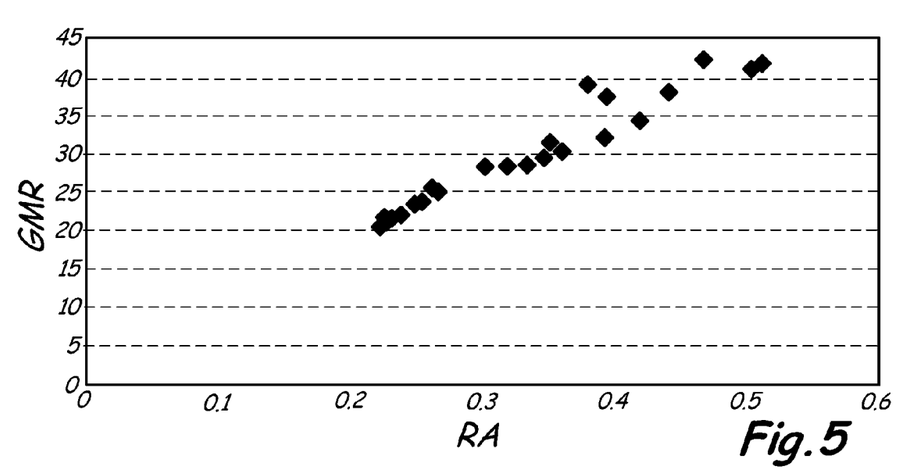
FIG. 5 is a graph showing GMR results for CCP-CPP reader stacks having varying thicknesses and RA products.

FIG. 5 illustrates GMR results at various RA in the range of 0.22~0.5 $\Omega\mu m^2$ for the CCP reader stack. The thickness of the CCP spacer layer ranged from about 4 Å to about 8 Å with the RA product increasing with increased thickness. High GMR values of about 21%, 28.5%, 37.5%, and 41% were achieved as RA is about 0.22, 0.3, 0.4, and 0.5 $\Omega\mu m^2$ respectively. Such high GMR at a low RA regime is attributed to the CCP-CPP spacer layer, between the free layer and the reference layer.

Table 1 summarizes some typical GMR, RA, Q, and freelayer H1 values for the CCP-CPP reader stack. The data shown in Table 1 and the data in FIG. 5 are from the same set of devices. The Q value, which is defined as the ratio of GMR over RA, is high and is around 80~100. Unlike typical low RA for a pure MgO TMR stack that has very high free layer H1 (about 300~500 Oe as RA is in the range of 0.3~0.5 $\Omega\mu m^2$), the freelayer H1 for the CCP-CPP stack is small and is less than 100 Oe. That means that the CCP spacer layer of MgO and Cu is very continuous and can effectively decouple the magnetic interaction between the free layer and the reference layer.

TABLE 1

| RA | GMR | Q | H1 |
|---|---|---|---|
| 0.220 | 20.8 | 94.4 | 88.9 |
| 0.224 | 22.0 | 98.2 | 75.9 |
| 0.224 | 21.0 | 93.7 | 57.2 |
| 0.230 | 21.8 | 94.8 | 12.1 |
| 0.234 | 22.2 | 94.7 | 93.3 |
| 0.247 | 23.6 | 95.9 | 45.7 |
| 0.251 | 24.1 | 96.0 | 39.1 |
| 0.253 | 23.9 | 94.8 | 46.0 |
| 0.260 | 25.9 | 99.6 | 38.2 |
| 0.263 | 25.5 | 97.1 | 45.0 |
| 0.301 | 28.5 | 94.9 | 16.9 |
| 0.317 | 28.6 | 89.9 | 76.5 |
| 0.333 | 28.9 | 86.8 | 99.4 |
| 0.346 | 29.7 | 85.9 | 49.5 |
| 0.350 | 31.6 | 90.1 | 51.5 |
| 0.358 | 30.5 | 85.1 | 44.1 |
| 0.379 | 39.1 | 103.2 | 62.4 |
| 0.391 | 32.3 | 82.7 | 44.5 |
| 0.394 | 37.5 | 95.3 | 34.7 |
| 0.418 | 34.5 | 82.4 | 30.1 |
| 0.442 | 38.0 | 86.1 | 45.5 |
| 0.468 | 42.1 | 90.1 | 46.6 |
| 0.504 | 41.0 | 81.3 | 2.3 |
| 0.511 | 41.6 | 81.4 | 42.9 |

Figure 6:
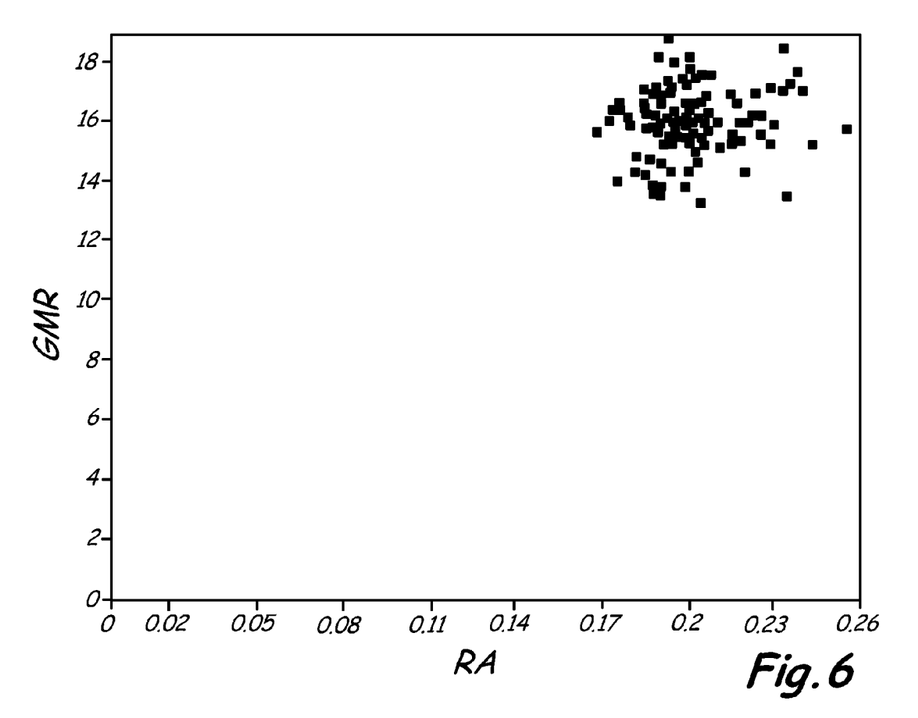
FIG. 6 shows a graph of GMR and RA distribution with a sensor size of 0.15 μm in diameter.

FIG. 6 illustrates the GMR and RA distribution for a circular shaped CCP-CPP reader stack with a diameter of 0.15 μm. The average GMR is about 16% as average RA is about 0.2 $\Omega\mu m^2$. The distribution of the GMR and RA values is tight, which implies the size of Cu conductive channels in the spacer layer MgO matrix is tiny and uniform.

Tables 2A-2C show a comparison of the GMR value and RA value distributions for the CCP-CPP reader and a conventional MgO TMR reader. For a fair comparison of the distribution of GMR and RA between both reader stacks, the RA values are similar for both reader stacks. LR39 (Table 2A), IL39 (Table 2B), and HL39 (Table 2C) represent three different sensor sizes of 0.15 μm, 0.2 μm, and 0.35 μm in diameter respectively. (The readers were circular in configuration). The standard deviation (stdev) from the CCP-CPP reader is smaller than that from the conventional MgO TMR stack for both GMR value and RA value. Both stacks have similar RA values. The stdev/mean also shows the similar trend that the proposed CCP-CPP stack has tighter distribution of both GMR values and RA values. The tight distribution is due to the unique spacer layer process by depositing MgO (or Mg) and Cu in the same chamber. The size of Cu conductive channels can be controlled on a nanometer scale, which is smaller than the reader sensor size. The tight distribution can significantly improve the production yield, which is very crucial for the mass production of read/write heads.

TABLE 2A

| | Mean | | | | | |
|---|---|---|---|---|---|---|
| | RA | | | GMR | | |
| Stack | LR39 | IL39 | HL39 | LR39 | IL39 | HL39 |
| MgO TMR | 0.63 | 0.66 | 0.67 | 52.66 | 53.37 | 54.13 |
| New CCP | 0.74 | 0.78 | 0.84 | 34.00 | 33.28 | 33.64 |

TABLE 2B

| | Stdev | | | | | |
|---|---|---|---|---|---|---|
| | RA | | | GMR | | |
| Stack | LR39 | IL39 | HL39 | LR39 | IL39 | HL39 |
| MgO TMR | 0.135 | 0.118 | 0.063 | 6.153 | 5.972 | 3.530 |
| New CCP | 0.106 | 0.085 | 0.045 | 2.071 | 2.767 | 1.089 |

TABLE 2C

| | Stdev/Mean | | | | | |
|---|---|---|---|---|---|---|
| | RA | | | GMR | | |
| Stack | LR39 | IL39 | HL39 | LR39 | IL39 | HL39 |
| MgO TMR | 0.214 | 0.179 | 0.093 | 0.117 | 0.112 | 0.065 |
| New CCP | 0.143 | 0.110 | 0.054 | 0.061 | 0.083 | 0.032 |

Although the present invention has been described with reference to preferred embodiments, workers skilled in the art will recognize that other embodiments are also possible. For example, although the CCP-CPP stack has been described in the context of a magnetoresistive device having a CCP-CPP spacer layer between a fixed reference layer and a free layer, the invention is also applicable to other structures, such as a trilayer structure in which the CCP-CPP spacer layer is positioned between two ferromagnetic free layers.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A magnetoresistive device comprising:
    a first magnetic layer comprising one or more of CoFeB, CoFe, and $Co_2MnX$, where X is from a group consisting of Ge, Si, Al, Ga, and Sn;
    a second magnetic layer comprising one or more of CoFeB, CoFe, and NiFe;
    a spacer layer positioned between the first magnetic layer and the second magnetic layer, the spacer layer comprising Cu current confined paths (CCP) extending between the first and second magnetic layers in a matrix of MgO; and
    a magnesium layer positioned between the spacer layer and the first magnetic layer to directly contact the Cu current confined paths (CCP) and the matrix of MgO of the spacer layer.

2. The magnetoresistive device of claim 1, wherein the magnesium layer is a first magnesium layer, and wherein the device further comprises a second magnesium layer positioned between the spacer layer and the second magnetic layer to directly contact the Cu current confined paths and the matrix of MgO of the spacer layer.

3. The magnetoresistive device of claim 1, wherein the spacer layer contains about 5 atomic percent to about 30 atomic percent Cu.

4. The magnetoresistive device of claim 1, wherein the spacer layer has a thickness of about 0.5 Å to about 15 Å.

5. The magnetoresistive device of claim 4, wherein the spacer layer has a thickness of about 4 Å to about 8 Å.

6. The magnetoresistive device of claim 1, wherein the first magnetic layer comprises CoFeB directly adjacent the magnesium layer.

7. The magnetoresistive device of claim 6, wherein the second magnetic layer comprises CoFeB directly adjacent a second magnesium layer between the spacer layer and the second magnetic layer.

8. The magnetoresistive device of claim 1, wherein the second magnetic layer comprises CoFeB directly adjacent the spacer layer.

9. The magnetoresistive device of claim 1, wherein the first magnetic layer, the second magnetic layer, and the MgO matrix have a body centered cubic crystal structure.

10. The magnetoresistive device of claim 1, wherein the device has a Q value defined as a ratio of giant magnetoresistive (GMR) value over resistance area (RA) product of about 80 to about 100.

11. The magnetoresistive device of claim 10, wherein the device has a freelayer H1 value of less than 100 Oe.

12. The magnetoresistive device of claim 1, wherein the device has a freelayer H1 value of less than 100 Oe.

13. The magnetoresistive device of claim 1, wherein the first magnetic layer is a pinned magnetic layer and the second magnetic layer is a free magnetic layer.

14. A magnetoresistive device comprising:
a magnetic layer;
a spacer layer adjacent the magnetic layer configured as a current confined path (CCP) layer comprising a plurality of conductive channels extending through a magnesium oxide tunnel barrier matrix; and
a magnesium layer deposited between the magnetic layer and the spacer layer, the magnesium layer comprising a seedlayer for the magnesium oxide tunnel barrier matrix, wherein the conductive channels and the magnesium oxide tunnel barrier matrix contactingly engage the magnesium layer.

15. The magnetoresistive device of claim 14, wherein the magnetic layer comprises one or more of CoFeB, CoFe, and $Co_2MnX$, where X is from a group consisting of Ge, Si, Al, Ga, and Sn, wherein the conductive channels are formed of Cu, and wherein the conductive channels and the magnesium oxide tunnel barrier matrix contactingly engage the magnesium layer.

16. The magnetoresistive device of claim 14, wherein the magnetic layer comprises one or more of CoFeB, CoFe, and NiFe, wherein the conductive channels are formed of Cu, and wherein the conductive channels and the magnesium oxide tunnel barrier matrix contactingly engage the magnesium layer.

17. The magnetoresistive device of claim 14, wherein the magnetic layer is characterized as a first magnetic layer, the magnesium layer is characterized as a first magnesium layer, and the device further comprises:
a second magnetic layer adjacent the spacer layer; and
a second magnesium layer deposited between the second magnetic layer and the spacer layer in contact with the plurality of conductive channels and the magnesium oxide tunnel barrier matrix of the spacer layer of the spacer layer.

18. The magnetoresistive device of claim 17, wherein the device has a Q value defined as a ratio of giant magnetoresistive (GMR) value over resistance area (RA) product of about 80 to about 100.

19. An apparatus comprising:
a pinning layer comprising one or more of CoFeB, CoFe, and $Co_2MnX$, where X is from a group consisting of Ge, Si, Al, Ga, and Sn;
a first magnesium layer deposited contactingly adjacent the pinning layer;
a spacer layer contactingly adjacent the first magnesium layer configured as a current confined path (CCP) layer comprising a plurality of conductive channels of Cu extending through a magnesium oxide tunnel barrier matrix;
a second magnesium layer deposited contactingly adjacent the spacer layer; and
a free layer contactingly adjacent the second magnesium layer comprising one or more of CoFeB, CoFe, and NiFe.

20. The apparatus of claim 19 having a Q value defined as a ratio of giant magnetoresistive (GMR) value over resistance area (RA) product of about 80 to about 100.

* * * * *

UNITED STATES PATENT AND TRADEMARK OFFICE
CERTIFICATE OF CORRECTION

Page 1 of 1

PATENT NO. : 8,551,626 B2
APPLICATION NO. : 12/491936
DATED : October 8, 2013
INVENTOR(S) : Qing He, Yonghua Chen and Juren Ding It is certified that error appears in the above-identified patent and that said Letters Patent is hereby corrected as shown below:

In the Claims

In Col. 8, line 23
change "of the spacer layer of the spacer layer"
to "of the spacer layer."

Signed and Sealed this
Eleventh Day of February, 2014

Michelle K. Lee
*Deputy Director of the United States Patent and Trademark Office*